United States Patent
Thorngreen et al.

(10) Patent No.: US 7,965,088 B2
(45) Date of Patent: Jun. 21, 2011

(54) METHOD FOR DETERMINING THE TYPE OF CONNECTION OF AT LEAST TWO ELECTRICAL DEVICES AND SYSTEM COMPRISING SEVERAL ELECTRIC DEVICES

(75) Inventors: Thomas Kure Thorngreen, Taastrup (DK); Christinel Dorofte, Soenderborg (DK); Uffe Borup, Sydals (DK)

(73) Assignee: PowerLynx A/S, Soenderborg (DK)

( * ) Notice: Subject to any disclaimer, the term of this patent is extended or adjusted under 35 U.S.C. 154(b) by 156 days.

(21) Appl. No.: 11/922,307

(22) PCT Filed: Jun. 15, 2006

(86) PCT No.: PCT/DK2006/000347
§ 371 (c)(1),
(2), (4) Date: Feb. 3, 2009

(87) PCT Pub. No.: WO2006/133714
PCT Pub. Date: Dec. 21, 2006

(65) Prior Publication Data
US 2009/0237071 A1    Sep. 24, 2009

(30) Foreign Application Priority Data
Jun. 17, 2005   (DE) .......................... 10 2005 028 513

(51) Int. Cl.
*G01R 31/04* (2006.01)
*G01R 31/19* (2006.01)
(52) U.S. Cl. .................................. 324/538; 324/76.11
(58) Field of Classification Search .................. None
See application file for complete search history.

(56) References Cited

U.S. PATENT DOCUMENTS

| 6,127,621 | A | * | 10/2000 | Simburger | 136/246 |
| 6,157,308 | A | | 12/2000 | Byers | 340/635 |
| 6,215,312 | B1 | | 4/2001 | Hoenig et al. | |
| 6,947,864 | B2 | * | 9/2005 | Garnett | 702/118 |
| 2004/0039536 | A1 | | 2/2004 | Garnett | 702/58 |
| 2007/0285083 | A1 | * | 12/2007 | Kamata | 324/120 |
| 2009/0267632 | A1 | * | 10/2009 | Rowe et al. | 324/765 |

FOREIGN PATENT DOCUMENTS

| DE | 101 36 147 A1 | 2/2003 |
| EP | 0 690 542 A1 | 1/1996 |
| EP | 1 030 429 A2 | 8/2000 |

OTHER PUBLICATIONS

International Search Report for Serial No. PCT/DK2006/000347 dated Oct. 4, 2006.
Written Opinion for Serial No. PCT/DK2006/000347 dated Apr. 12, 2007.

* cited by examiner

*Primary Examiner* — Vinh P Nguyen
(74) *Attorney, Agent, or Firm* — McCormick, Paulding & Huber LLP (57) ABSTRACT

The invention relates to a method for determining the type of connection of at least two electric devices (5) whereby each device comprises a similar connector arrangement. The aim of the invention is to increase the reliability during the starting up process and during the operation of a system which comprises several electric units (5). According to the invention, a first device (5) modifies the voltage on the connector arrangement (11) and the modified voltage is determined as a first voltage, such that a second device (5) determines a second voltage on at least the connector arrangement (11) and determines whether an electric connection exists or not between the connector arrangements (11) of the devices (5) by comparing the determined comparison of the voltages.

17 Claims, 7 Drawing Sheets

METHOD FOR DETERMINING THE TYPE OF CONNECTION OF AT LEAST TWO ELECTRICAL DEVICES AND SYSTEM COMPRISING SEVERAL ELECTRIC DEVICES

CROSS REFERENCE TO RELATED APPLICATIONS

This application is entitled to the benefit of and incorporates by reference essential subject matter disclosed in International Patent Application No. PCT/DK2006/000347 filed on Jun. 15, 2006 and German Patent Application No. 10 2005 028 513.9 filed Jun. 17, 2005.

FIELD OF THE INVENTION

The invention concerns a method for determining the type of connection of at least two electrical devices, of which devices each has the same type of connector arrangement as the others. Further, the invention concerns a system having several electrical devices, all of which devices each has the same type of connector arrangement as the other devices, and a control device.

BACKGROUND OF THE INVENTION

In the following the invention is described by way of a system in which several sources of renewable energy are provided. These sources concern devices, which convert solar, wind, waterpower or other naturally occurring energies into electric energy. These energies are also known as "green energies".

The following description uses solar cells as examples for the creation of green energy. Solar cells are used to convert sunlight into electric energy. Solar cells are frequently connected together on a panel in order to produce a higher voltage and power than can be obtained from a single individual solar cell. Several panels are often then connected in series with one another to form a string.

A typical photovoltaic system uses a solar cell string, which makes available a varying electric power. This power depends for example on the strength of the solar radiation (morning, midday, evening), on shading and also on the ambient temperature. This power is converted by a direct current converter into a constant intermediate circuit voltage. An inverter stage then creates an alternating voltage which can either be used immediately, for example in household devices, or can be supplied into a higher-ranking network. In either case the electrical power can be a single-phase voltage or a multiple phase voltage.

In the case of a higher power requirement it is advantageous if several solar cell strings, separate from one another, are included in a system. These strings are connected in parallel with one another and with the input to the direct current converter. These solar cell strings however are then preferable ones which exhibit a generally similar behavior at their outputs, are of similar type, are of the same size, have the same orientation in respect to the sun, and have a similar shading. Accordingly, in many cases, the output powers, especially the output voltages, are different from one another. This leads to a non-optimal use of the solar cell strings.

It has therefore been previously proposed that the individual solar cell stings each be equipped with a dedicated direct current converter. The individual direct current converters then feed a predetermined voltage to the intermediate circuit of the power converter, for example by way of a voltage bus.

Such type of arrangement is known for example from DE 101 36 147 A1.

On other hand there are also systems or installations in which the solar cell strings in respect to their type, their size, their orientation, their shading and other factors are so similar that they produce output values, for example output voltages, which are more or less identical. In this case it can be advantageous to not only connect their outputs in parallel to the direct current converters, but also to connect inputs of the direct current converters in parallel.

A direct current converter customarily has two characteristics which in many respects are disadvantageous.

First, there is an upper limit for the input power limit which cannot be exceeded without the direct current converter being damaged. Secondly, a direct current converter often has a reduced degree of effectiveness when it works with a low input power.

If one now connects the individual solar cell strings (in the following these are also in a shortened way referred to as "solar cells") with several direct current converters, one can then for one thing see to it that the electric power is uniformly distributed to the direct current converters. For another thing one can turn off individual direct current converters if the electrical input power is too low. A direct current converter has a certain basic consumption of power even when it converts no electric power. The turning off of direct current converters therefore takes place by way of a control device in dependence of the amount of delivered electrical energy.

The control device must now "know", in what configuration the individual direct current converters are arranged in the system. The control device may for example only turn off such direct current converter whose solar cells are connected with another direct current converter.

This information can be made available to the control mechanism by a manual input. A supervising person can for example turn a switch or enter a parameter through a keyboard. In this case however there exists to a considerable degree the danger of a faulty input, especially in the case of large photovoltaic systems made up of several hundred solar cell strings.

If the control device is supplied with faulty information this can lead to an inefficient use of the solar cell strings.

SUMMARY OF THE INVENTION

The invention therefore has as its object to increase the reliability of a system with several electrical devices during the starting up and operation of the system.

This object is solved by a method of the previously mentioned kind in that a voltage at the connector arrangement of a first device is changed and the changed voltage is determined as a first voltage, that then at the connector arrangement of at least a second device a voltage is determined and that then by way of a comparison of the voltage is a determination is made as to whether the connector arrangements of the two devices have an electric connection with one another or not.

With this method it is possible in a quasi-automatic way to determine whether the individual electrical devices are connected by their connector arrangements in parallel or not. With reference to the above described photovoltaic system one can therefore determine whether the individual solar cell strings are only individually connected with a direct current converter or whether several direct current converters are connected by means of their inputs to one another and with the solar cells. In doing this one makes use of the knowledge that the changing of a voltage at the connector arrangement of one electrical device brings about a corresponding change of the voltage at the connector arrangement of another electrical device if the two involved connector arrangements are connected with one another. If a connection does not exist then a change at the connector arrangement of the first device does not lead to a corresponding change of the voltage at the connector arrangement of the other device. This holds true above all if the connector arrangements are directly connected with one another so that no further construction components (apart from conductors and connectors), are arranged between the connector arrangements.

Preferably the voltage at the first device is changed by loading the first device. Especially in the case of renewable sources of energy, for example solar cells, there is a certain internal resistance. The voltage accordingly falls with the loading from an idle running voltage to an operating voltage. When the connector arrangements of two device are connected with one another then the loading has an effect on both of the devices so that the voltages at both devices become lowered. If such a connection between the connector arrangements on the other hand does not exist, then the voltages are not correspondingly changed.

Preferably the determination is repeated and another device is used as the first device in sequentially following determinations. One can repeat the determinations for example at every start up of the system or always when the system or the installation begins to feed electrical power into an over-ranking network. In this way it is assured that a change in the configuration perhaps made during a pause in the operation cannot be overlooked. Such a change can also unintentionally take place. Thereby it can be of advantage if the same device is not always used as the first device and that instead the first device is continuously changed.

Preferably an input connector arrangement is used as the connector arrangement, which input connector arrangement is connected with an energy source. In this way one uses the internal resistance of the energy source in order to create the voltage change.

In this case it is preferred that a source of renewable energy is used as the energy source. One such source is also referred to as a renewable energy source or as a source of renewable energy. In the case of such source the problem presented is of considerable degree.

Alternatively thereto an output connector arrangement can also be used as the connector arrangement. In this case, for example, the internal resistance of the electrical device itself is used for changing the output voltage.

In a preferred embodiment it is provided that if with a determination it is found that the first device is not connected with another device some other device is then used as the first device and it is tested in reference to the remaining devices. In this way one is therefore assured that different connection configurations are detected. In a system or installation it can be that several devices are connected in parallel while other devices are operated in isolation. This can be reliably determined with the proposed method.

In connection with this it is preferred that the determinations are repeated and some other device is used as the first device up until all but one device has been used as the first device. Thereby one tests, all connections in order to determine where parallel connections exist, that is, whether the connector arrangements are connected with one another or not.

In a preferred arrangement it is provided that several devices having similar behaviors are used and their connector arrangements are connected with one another and used in common as a first device. In this case it is already known that these devices are connected with one another. One can then use a group of devices as the "master" and test to see whether the remaining devices are connected in parallel with this group or not.

In the case of an alternating voltage it is also of advantage if a characteristic value is determined. The characteristic value is a value which does not change with the same frequency as the alternating voltage; for example it is the RMS value, a determined peak to peak voltage or a rectified average value. One such value can be relatively easily determined. It is sensitive enough to carry out the above mentioned determination.

The invention is solved by a system of the initially mentioned kind in that a sensor is arranged at each connector arrangement which is connected with the control device, with the control device having means to change the voltage at each connector arrangement, in that a comparator is provided for comparing the voltages at different connector arrangements with one another, and in that a memory device is provided in which are stored values dependent on output signals of the comparator indicating whether the connector arrangements of the electrical devices are connected with one another or not.

The control device therefore carries out the above described method and "takes notice of" which electrical devices are connected with one another and which are not. It can also of course be that several groups of electric connectors are connected with one another. The control device then has the possibility of controlling the individual devices in each group as is desirable for an optimal operation of the system.

Preferably the electrical devices are formed as direct current converters. If the direct current converts are connected with one another the control device then, turns off individual direct current converters if the input power is not sufficient.

Preferably the output connector arrangements of the direct current converters are connected in parallel. The direct current converters have therefore a common output voltage.

Preferably the output connector arrangements are connected with an inverter. The direct current converters feed therefore a intermediate circuit from which the inverter takes the electrical power.

In an alternative embodiment it is provided that the electrical devices are formed as inverters, and here the same is basically true.

Here it is of advantage if the output connector arrangements of the inverters are connected in parallel. Then it can be determined with such a system which inverters at their outputs are connected in parallel and can be driven in common and which can need to be used for individual operation.

Preferably the connector arrangements are formed as input connector arrangements which each of which is connected with a source of renewable energy. In the case of these sources they can concern for example solar cell strings, wind power systems, water power systems, fuel cells or the like.

BRIEF DESCRIPTION OF THE DRAWINGS

The invention in the following is described by way of exemplary embodiments in combination with the drawings. The drawings are.

DETAILED DESCRIPTION OF THE INVENTION

Figure 1:
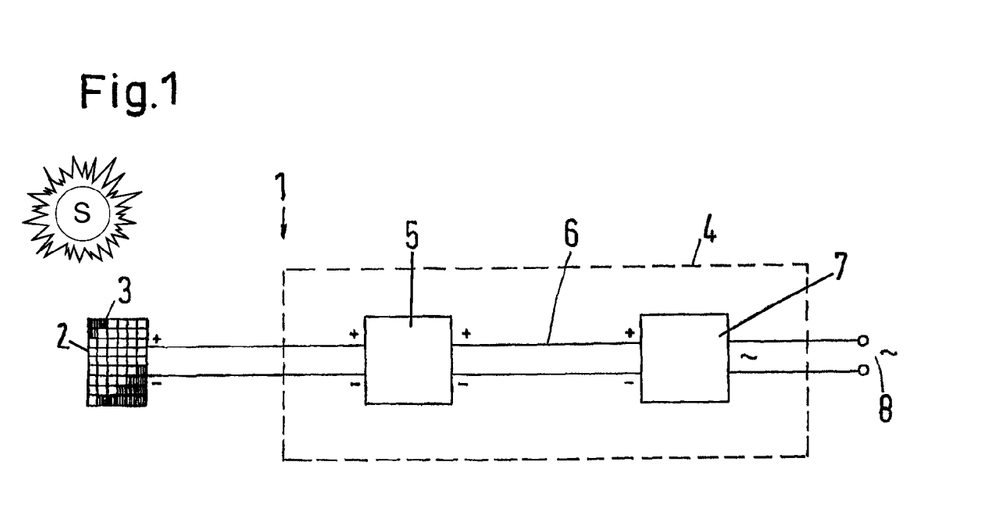
FIG. 1 is a schematic illustration for explaining a system with one solar cell string.

FIG. 1 shows in schematic representation a system 1 for the conversion of an energy source 'S' that is solar energy into electric energy. The terms "system" and "installation" are used as synonyms in the following. The energy source may be in the form of solar, wind, waterpower, or other naturally occurring energies. These energies are also known as "renewable enerhy" or "green energies".

The system 1 has a string 2 with schematically illustrated solar cells 3. Usually a plurality of solar cells 3 are arranged on a panel or board. Several such panels in series then form the string 2. At the output of the string 2 the solar cells 3 deliver a direct voltage. The strength of the voltage varies, for example in dependence on the solar radiation intensity, shading, the ambient temperature or other influences.

The string 2 is connected with a power converter 4, which also can be called a power inverter. The power converter has first a direct current converter 5 which changes the changing direct voltage, delivered by the string 2, into a constant direct voltage and gives it to an intermediate circuit 6. The intermediate circuit 6 is connected with an inverter 7 which changes the direct voltage from the intermediate circuit 6 into a single phase or multi phase alternating voltage and provides it to a network 8.

Figure 2:
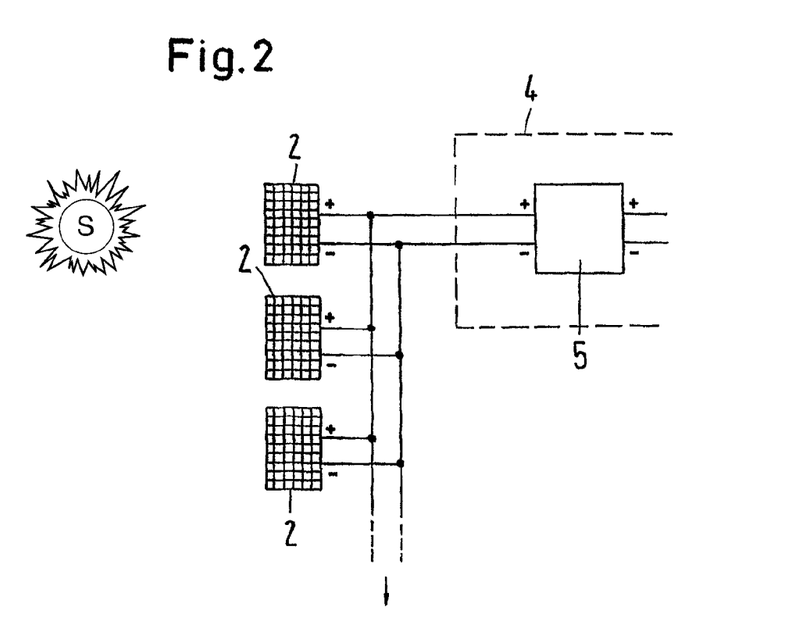
FIG. 2 is a system with several solar cell strings.

If the output power of a single string is not sufficient, then, as illustrated in FIG. 2, one can use several strings 2. The outputs of these strings 2 are connected with one another. The connected outputs are then connected with the power converter 4 which can be made in the same way as in FIG. 1.

Figure 3:
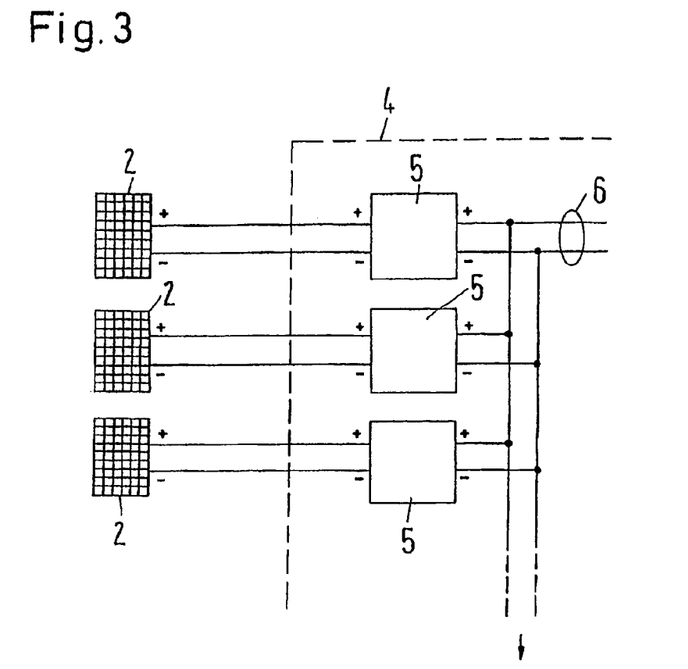
FIG. 3 is a system with several solar cell strings, each of which strings has a dedicated direct current converter.
Figure 4:
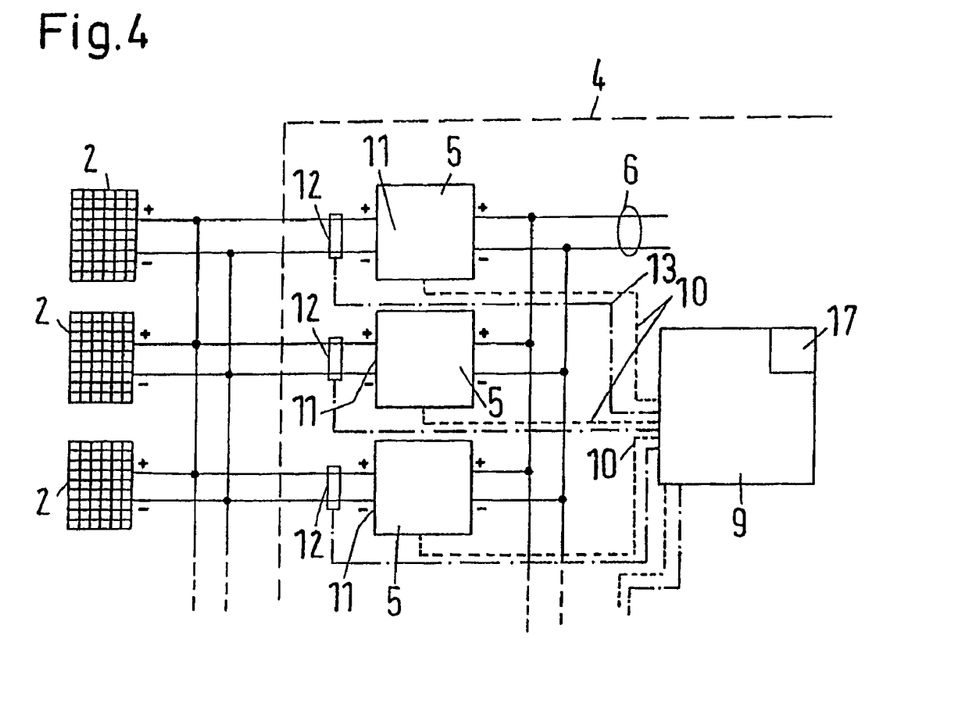
FIG. 4 is a possible circuit for the system according to FIG. 3.

An arrangement such as shown in FIG. 2 is possible if the individual strings 2 at their outputs exhibit a similar behavior, especially if they provide the same voltage. This however is usually only the case if the strings 2 and the solar cells 3 of the same kind, are arranged in similar ways, experience the same radiation, are similarly shaded, etc. In most instances this is not the case. Therefore it is advantageous, as illustrated in FIG. 3, to so build the power converter 4 so that for each string 2 a dedicated direct current converter 5 is provided. All of the direct current converters 5 then feed into the intermediate circuit 6. One such an arrangement is, as mentioned above, known for example from DE 101 36 147 A1.

The arrangement according to FIG. 3 requires, on one hand, that each direct current converter 5 is compatible with the power delivered to it by the associated string 2. If a delivered power exceeds an upper limit this can lead to a damaging or even destruction of the direct current converter. On the other hand, most direct current converters 5 have at a low power level a poor degree of effectiveness. They require electric power even though little or no output power is outputted. Because of these grounds it is often preferred to connect the individual strings 2 in parallel in front of the direct current converters 5, to connect their outputs to one another, and to then allow the direct current converters 5 to feed in common the intermediate circuit 6.

In this case a control device 9 is required. The control device 9 controls, as indicated by the broken conductor lines 10, the individual direct current converters 5 depending on their consumption. The parallel connection of the individual strings 2 makes it possible to distribute the electrical power outputted from the strings 2 to the direct current converters 5 so that an overloading is not to be feared. On the other hand, the control device 9 can also simply turn off individual direct current converters if the electric power delivered from the strings 2 is too low. In this case some of the power loss attending each direct current converter can be saved by the direct current converters 5 that are turned off.

Figure 6:
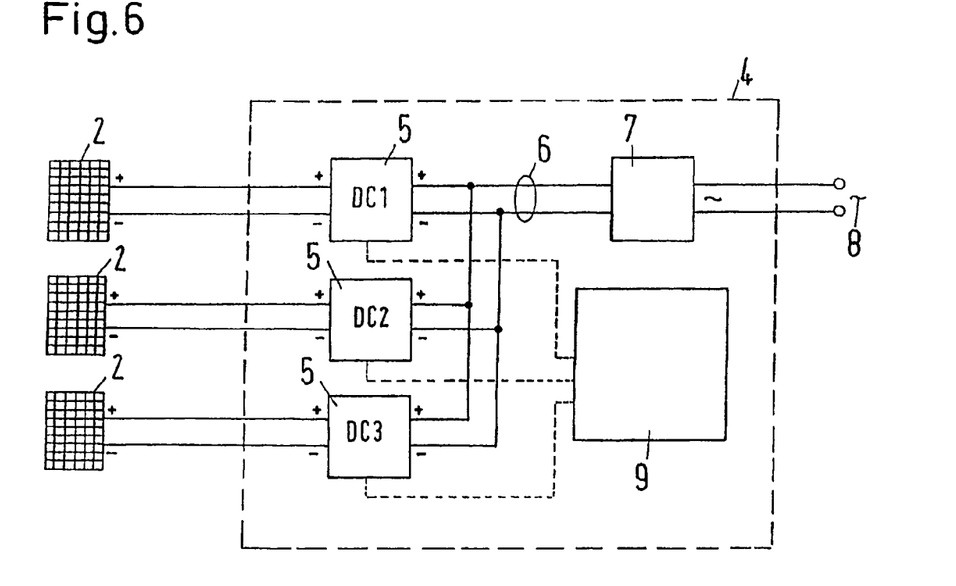
FIG. 6 is a first circuit for the system of FIG. 4.
Figure 7:
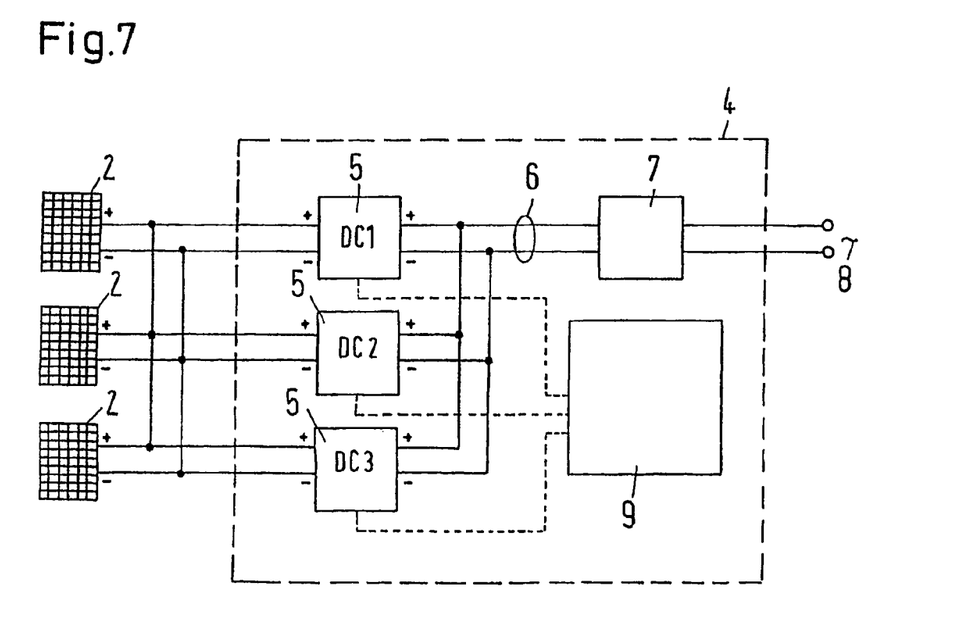
FIG. 7 is a second circuit for the system of FIG. 4.
Figure 8:
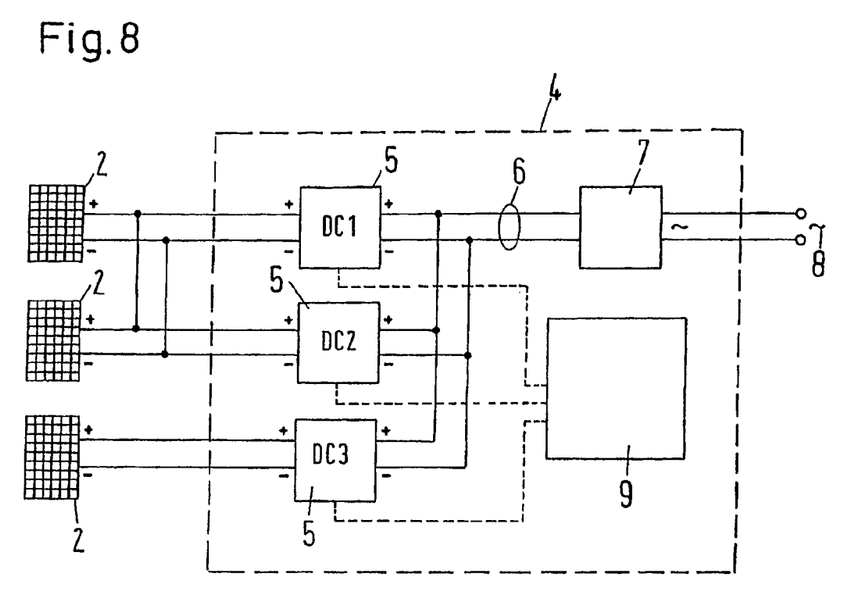
FIG. 8 is a third circuit for the system of FIG. 4.

In the assembly of a system it can be that individual connections between the outputs of strings 2 are not made properly, or are unintentionally omitted. Also during operation of the system it can happen that such a connection is interrupted, for example by a storm, water damage or some other natural event. Also human tamperings are possible. Three different configurations which can then result are illustrated in FIGS. 6 to 8. These are the discussed in further detail below. In FIG. 6 for example the strings 2 are really not connected with one another. In FIG. 7 all strings are connected with one another. In FIG. 8 only two strings 2 are connected with one another.

So that the control device 9 can determine in what configuration the strings 2 are connected with the power converter 4, at the input connector arrangement 11 of each direct current converter 5 is arranged a sensor 12 which is connected with the control unit 9 by conductor lines 10, 13 indicated by broken lines. The conductor lines 10, 13 can have different forms. They can be electrical conductors or optical conductors. One can also make the links between the control device 9, the direct current converters 5 and the sensors 12 wireless and to effect the corresponding signal transmission by way electromagnetic waves, light, sound or the like. The sensor 12 at the input connector arrangement 11 of the direct current converter 5 is here formed as a separate element. It will be understood however that the control device 9 can also directly obtain the corresponding information from the direct current converter 5, for example by way of a voltage measurement at the input connector arrangement 11.

In order that the control device 9 can now determine the configuration in which the strings 2 are connected to the power converters, 4 it carries out an algorithm. This is done at least after the commencement of operation, however preferably more often, for example, after every power free operation or at regular intervals.

This algorithm can be briefly described as follows.

Figure 11:
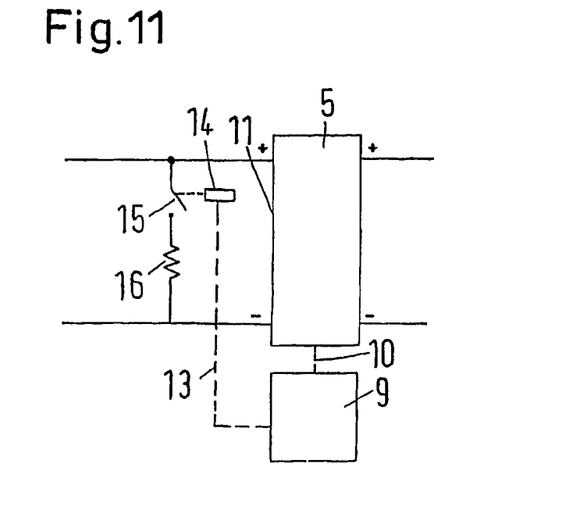
FIG. 11 is a device for changing the voltage at a direct voltage converter.
Figure 12:
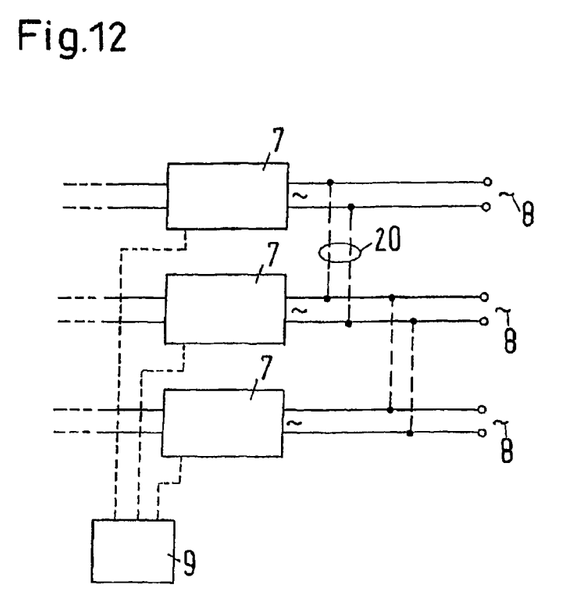
FIG. 12 is a further modification of a configuration in part.

The control device 9 selects a first direct current converter 5 and reduces the voltage at it. This takes place preferably in that the control device so controls the direct current converter that it delivers electrical energy into the intermediate circuit 6. Another means is illustrated schematically in FIG. 11. There the control device 9 carries a relay solenoid 14 which closes a switch 15. With the closing of this switch a resistance 16 is inserted in parallel with the input connector arrangement so that a current flows through this resistance 16. Since the string 2 has an internal resistance this leads to a lowering of the voltage at the input connector arrangement 11. At the input connector arrangements 11 of the other direct converters 5 on the other hand no power is removed. The voltage at the input connecter arrangements 11 of the other direct current converters 5 are measured. If the measured voltage at a specific input changes in the same way as the voltage at the input of the first direct current converter then one can conclude that the outputs of the strings 2 connected with those input connector arrangements 11 of the direct current converters 5 in question, are connected. In other words they are connected in parallel. If the voltages do not correspondingly change then this is not the case. The control device 9 makes this determination and stores a note of this determination in a schematically illustrated memory 17 for use in the future, that is until the next testing, indicating whether the strings 2 are connected in parallel or not.

The control device 9 therefore chooses one direct current converter 5 as the "master". The remaining direct current converters 5 are taken as "slaves". The master is brought into use and power is taken from its input. The slaves are set into a condition where such a power removal does not take place. At the master the voltage from an idle running voltage, therefore the idle running voltage of the strings connected with the master, drops since each the string 2 has an internal resistance. The power removed from the input connector arrangement 11 increases until the input voltage at the master has fallen to a predetermined portion of the idle running voltage. After a predetermined time the voltage difference between the master and each slave is calculated or determined some other way. If with an output voltage of for example 80 V of a string 2 the difference is larger than 15 V one can then assume that no parallel connection of the string 2 to the direct current converter 5 exists. If a difference is smaller than 10 V one can assume that a parallel connection does exist between the input of the master and the input of the slave.

Figure 5:
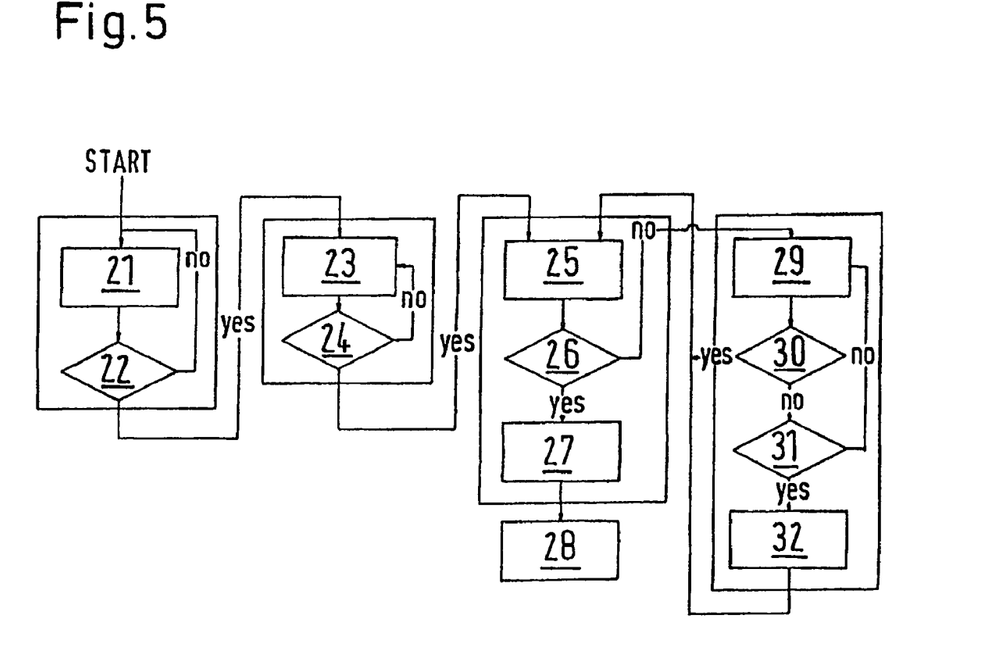
FIG. 5 is a full diagram.

A corresponding algorithm is illustrated schematically in FIG. 5. In a step 21 one waits until at least two direct current converters 5 have already reported. This is, for example, the case if at their input connector arrangements 11 a sufficient direct voltage exists. In the decision 22 a test is made of whether two direct current converters have already reported. If this is not the case the wait continues. If two direct current converters 5 have reported, they are calibrated in a step 23. For this, all direct current converters 5 are turned off. The control device 9 indicates the measured voltage difference between the individual direct current converters 5. In doing this one can for example compensate the measured voltage of the individual direct current converters 5 with offsets. If the step of the calibration is successfully carried out (decision 24) in a step 25 it is investigated, if all the modules, that is all direct current converters 5, have been tested. If only one direct current converter 5 remains untested, this direct current converter 5 is recorded in the memory 17 as being "individual mode", that is the control device 9 has determined that the inputs of this direct current converter 5 have not been connected in parallel with any other direct current converter 5. If the decision 26 is "yes", then in step 27 all faults which have possibly appeared are outputted, and the process is ended (step 28).

If there remain any untested direct current converters 5, the next direct current converter 5 is tested in step 29. If this test is interrupted (decision 30), a return is made to step 25. In decision 31 a test is made as to whether the testing has been carried out to the end. If this is the case, in step 32 the operating mode for each direct current converter 5 is determined, that is arranged for individual operation or arranged for operation in parallel connection with other direct current converters 5.

This will be explained in more detail in the following with the help of FIGS. 6 to 8. Here for purposes of clarity the sensor 12 and the associated conductor lines 13 are no longer shown.

In FIG. 6 the strings 2 are each connected only with their respective direct current converters 5. These converters for a simple distinction are designated DC1, DC2 and DC3.

If the power converter 4 is connected with the network 8, the calibration is carried out while all of the direct current converters 5 are turned off.

Then DC1 is turned on, in order to deliver energy, while DC2 and DC3 remain turned off. After a predetermined time, for example forty five seconds, the control device 9 knows that DC1 is not connected in parallel with DC2 or DC3. Therefore DC1 may be allowed to create further energy. The memory device 9 stores a note that DC1 is arranged individually.

Thereafter DC2 is turned on and delivers energy. DC3 remains turned off. After a predetermined time the control device 9 knows that DC2 and DC3 are not connected in parallel, because at the input of DC3 no voltage change has occurred. DC2 therefore may create (that is delivered) the further energy in the individual operation mode.

Since DSC3 is the last untested direct current converter 5 it cannot have been connected in parallel with any other direct current converter 5. On this basis the control device 9 then makes note of the fact that DC3 likewise is operating in the individual operation mode, and DC3 can create further energy. With "energy creation" it is here meant that the involved direct current converter 5 supplies the current from the associated strings 2 of solar cells 3 to the intermediate circuit 6.

FIG. 7 shows an example in which the three strings 2 are connected parallel. In this case the method runs as follows: the power converter 4 is connected with the network 8. The calibration is carried out while the direct current converters 5 are turned off. The direct current converter DC1 is then turned on, that is at the its input. The two direct current converters DC2 and DC3 remain turned off. After a predetermined time the control device knows that DC1 is connected in parallel with DC2 and DC3. All three direct current converters 5 are therefore recorded as being connected in parallel. Since no untested direct current converter 5 remains, the test is taken to be completed.

In FIG. 8 only two strings 2 are connected in parallel with one another. The third string is only connected with the direct current converter DC3. The failing connection may have been forgotten during the assembly. It is also possible that it could have been damaged by a storm or something similar. In this case the test runs as follows.

The power converter 4 is connected with the network 8. The calibration is carried out while the direct current converters 5 are turned off.

DC1 is then turned on while DC2 and DC3 are turned off. After a predetermined time the system knows that DC1 is connected in parallel with DC2 DC1 and DC2 are therefore stored as being connected in parallel.

Since DC3 is the last untested direct current converter 5, it cannot be connected in parallel with any other direct current converter 5. DC3 is then know to be arranged as an individual direct current converter. Since the arrangement condition of no untested direct current converter 5 remains unknown the test is taken to be completed.

The voltage to which the input of the master sinks depends on the characteristics of the power source, in the present case on the characteristics of the strings 2. Moreover, the sensitivity of the voltage measuring technique can also play a role, as can also the precision of the voltage measurement and similar factors. If one for example uses a 3 kW converter which is driven by a string 2 of solar cells, then, for example, a voltage of 80% of the idle running voltage is suitable.

The predetermined time which is allowed to elapse in order to obtain a stable condition, that is to test whether the voltages have developed to be similar or different, depends on the transient properties of the system. In the above-mentioned example of a 3 kW converter one can consider a period of 45 seconds as sufficient for the stabilization of the voltage.

As already above mentioned, the control device 9 is connected with the direct current converters by way of conductor lines. They can be implemented for analog or digital signals as a bus or wireless system. Also the signals of the sensors 12 can be transmitted correspondingly.

The control device 9 need not be physically separated from the direct current converters 5. It can, for example, be built into one of the converters and from there control the remaining direct current converters 5 with the help of the above described conductor lines.

The control device 9 can, in an advantageous embodiment, each time start with a different direct current converter 5, that is in the first test start with DC1, in the second test start with DC2, in the third test start with DC3, and in the fourth test start again with DC1. In this way one can identify faults.

The previous method is useful if two or more direct current converters with their connected strings 2 of direct current cells 3 work as a master unit. In this case the control device makes certain that the load is distributed in a given way to the direct current converters 5. In this case it is determined whether the input of a direct current converter 5 which does not belong to the master unit is connected in parallel to the input of some direct current converter 5 which belongs to the master unit.

One can also use a plurality of control devices 9, for example one in each direct current converter 5. These different control devices 9 can then work together to decide which direct current converter 5 shall act as master and which as slaves.

Figure 9:
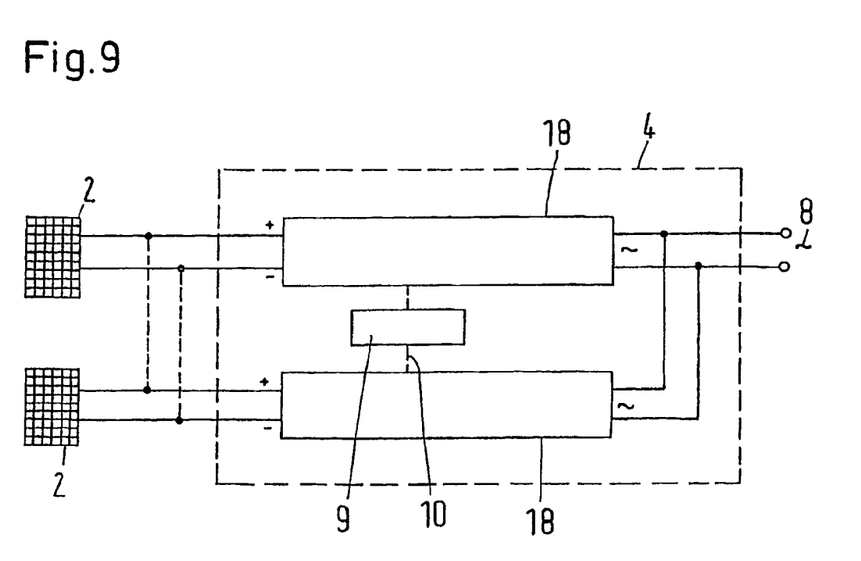
FIG. 9 is a modified embodiment of a system with several solar cell strings.

The previous method can also be used if the power converter 4 uses units 18 which feed the power from the strings 2 directly to the network 8, that is without an outwardly leading direct voltage intermediate circuit 6.

Figure 10:
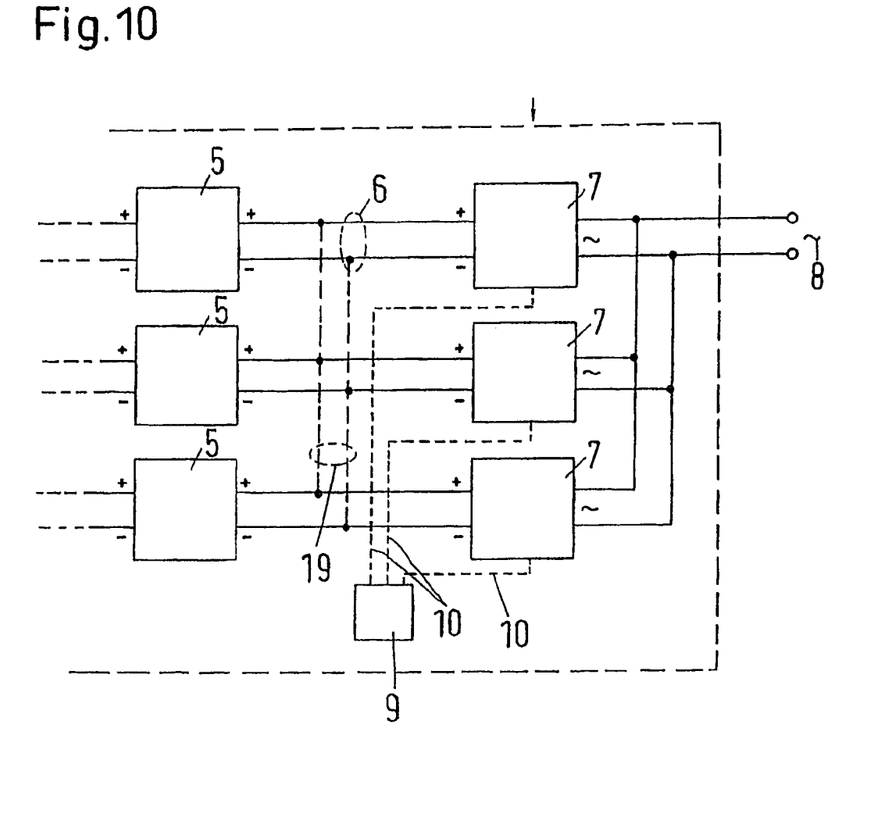
FIG. 10 is a further modification of a system in part.

The previous method can also be used in a system that has a plurality of inverters 7, as is for example illustrated in FIG. 10. With broken lines 19 possible connections are here shown for the parallel connection of the inverters' 7 inputs. The inputs, which are described above, are in this case inputs of the inverters from the intermediate circuit 6. The control device 9 controls in this case the inverters 7, that is it turns them on or off as necessary, in order to create the required power condition.

The above described method can also then be used if the outputs of the inverter 7 are connected in parallel. Possible connections are illustrated by the broken lines 20. In this case power is created at an output and a measurement is made of whether created voltage is obtainable at other outputs. The advantage of such a procedure is that one can turn off one or more output stages, that is one or more of the inverters 7, in order to conserve power, if the input power is too low.

It has been described above that a voltage is lowered in order to determine whether units are connected in parallel or not. Naturally one can also increase a voltage.

The previous method functions both with direct voltages and alternating voltages. In the case of alternating voltages it is sufficient to determine the RMS value or another value, for example a peak voltage, which changes more slowly than the frequency of the alternating voltage, or as the case may be what is determined is an average value of a rectified voltage or the like.

While the present invention has been illustrated and described with respect to a particular embodiment thereof, it should be appreciated by those of ordinary skill in the art that various modifications to this invention may be made without departing from the spirit and scope of the present invention.

What is claimed is:

1. A method for determining the type of connection existing between at least two electrical devices in a system, each of the at least two electrical devices having a similar connector arrangement connected with an energy source, the method comprising the steps of:
    determining a first voltage change at the connector arrangement of a first device, while the first device is loaded;
    determining a second voltage change at the connector arrangement of at least one second device; and
    determining by way of a comparison of said first and second voltage changes whether an electrical connection exists between the connector arrangements of said first and second devices.

2. The method according to claim 1, wherein the at least two electrical devices include at least a third electrical device and the third electrical device is used in place of the first device in the determining of whether an electrical connection exists.

3. The method according to claim 1 wherein an input connector arrangement is used as the connector arrangement.

4. The method according to claim 1, wherein the energy source is a renewable energy selected from the group consisting of solar, wind, waterpower, and other naturally occurring energies.

5. The method according to claim 1, wherein an output connector arrangement is used as the connector arrangement.

6. The method according to claim 1, wherein if it is determined that the first device is not connected with the second of the at least two electrical devices, then another of the at least two electrical devices is used as the first device and it is tested in reference to any remaining at least two electrical devices.

7. The method according to claim 6, wherein the determinations are repeated while another device is used as the first device, until all but one of the devices have been used as the first device.

8. The method according to claim 1, wherein several devices which have similar behaviors and whose connector arrangements are connected with one another are used in common as the first device.

9. The method according to claim 1, wherein in the case of an alternating voltage a characteristic value is determined, the characteristic value being selected from the group consisting of RMS value, peak voltage, an average value of a rectified voltage, and another voltage value that changes more slowly than the frequency of the alternating voltage.

10. A method for determining a type of connection between a plurality of electrical devices similarly connected with an energy source through a corresponding connector arrangement, the method comprising the steps of:
    determining a first voltage change at a first of the connector arrangements that connects a first of the plurality of electrical devices;
    determining a second voltage change at a second of the connector arrangements that connects a second of the plurality of electrical devices; and
    comparing the first voltage change with the second voltage change to determine the existence and type of electrical connection between the first and second of the plurality of devices.

11. The method according to claim 10, further comprising the steps of:
    determining a third voltage change at a third of the connector arrangements that connects a third of the plurality of electrical devices; and comparing the second voltage change with the third voltage change to determine the existence and type of electrical connection between the second and third of the plurality of devices.

12. The method according to claim 10, wherein the energy source is a source of renewable energy.

13. The method according to claim 10, wherein each of the connector arrangement is an input connector.

14. The method according to claim 10, wherein each of the connector arrangement is an output connector arrangement.

15. The method according to claim 10, wherein the steps are repeated with each of the remaining plurality of devices being used as the first device, until all but one of the plurality of devices have been used as the first device.

16. The method according to claim 10, wherein more than one of the plurality of devices have similar behaviors and the connector arrangements of the more than one of the plurality of devices are connected with each other and are together used as the first device during the determination.

17. The method according to claim 10, wherein in the case of an alternating voltage a characteristic value is determined, the characteristic value being selected from the group consisting of RMS value, peak voltage, an average value of a rectified voltage, and another voltage value that changes more slowly than the frequency of the alternating voltage.

* * * * *